(12) United States Patent
Lee et al.

(10) Patent No.: US 6,841,338 B2
(45) Date of Patent: Jan. 11, 2005

(54) PHOTORESIST COMPOSITION AND METHOD OF FORMING A PHOTORESIST PATTERN WITH A CONTROLLED REMNANT RATIO

(75) Inventors: Dae-youp Lee, Kyungki-do (KR); Jeong-lim Nam, Kyungki-do (KR); Do-yul Yoo, Seoul (KR); Jeung-woo Lee, Kyungki-do (KR)

(73) Assignee: Samsung Electronics Co. Ltd. (KR)

( * ) Notice: Subject to any disclaimer, the term of this patent is extended or adjusted under 35 U.S.C. 154(b) by 123 days.

(21) Appl. No.: 10/173,375

(22) Filed: Jun. 17, 2002

(65) Prior Publication Data
US 2003/0049565 A1 Mar. 13, 2003

(30) Foreign Application Priority Data
Aug. 16, 2001 (KR) .................................... 2001-0049317

(51) Int. Cl.⁷ ................................................ G03C 5/00
(52) U.S. Cl. .................... 430/311; 430/322; 430/396; 430/5; 430/270.1
(58) Field of Search ................ 430/311, 322, 430/396, 5, 270.1

(56) References Cited

U.S. PATENT DOCUMENTS

| 5,741,613 | A |   | 4/1998  | Moon et al.  | 430/5   |
|-----------|---|---|---------|--------------|---------|
| 5,789,116 | A |   | 8/1998  | Kim          | 430/5   |
| 5,814,424 | A |   | 9/1998  | Shin         | 430/5   |
| 5,851,706 | A |   | 12/1998 | Lim et al.   | 430/5   |
| 5,853,921 | A |   | 12/1998 | Moon et al.  | 430/5   |
| 5,895,735 | A |   | 4/1999  | Yoon         | 430/5   |
| 6,432,588 | B1 | * | 8/2002 | Tzu et al.   | 430/5   |
| 6,593,056 | B2 | * | 7/2003 | Takeda et al.| 430/170 |
| 2001/0055726 | A1 | * | 12/2001 | Kanna et al. | 430/270.1 |

* cited by examiner

Primary Examiner—Mark F. Huff
Assistant Examiner—Daborah Chacko-Davis
(74) Attorney, Agent, or Firm—Myers Bigel Sibley & Sajovec

(57) ABSTRACT

A photoresist composition may include formulas 1 and 2:

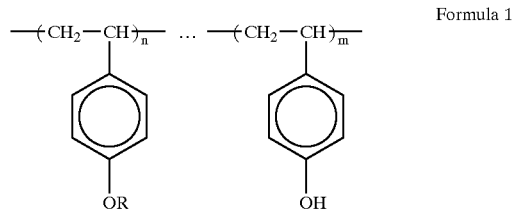

Formula 1 where R is an acetal group or a ter-butyloxy carbonyl (t-BOC) group, n and m are integers, $n/(m+n)$ is 0.01–0.8, and $m/(m+n)$ is $1-[n/(m+n)]$,

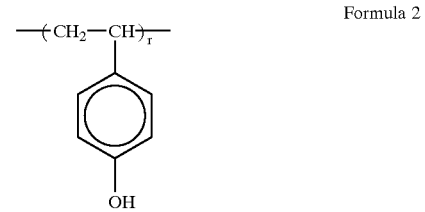

Formula 2 where r is an integer between 8–40.

A method for forming photoresist patterns may include forming a photoresist layer on a semiconductor substrate and exposing and developing the photoresist layer using a mask pattern that includes first areas having a light transmissivity of about 100% and second areas having a light transmissivity of between about 10% and about 30%.

55 Claims, 4 Drawing Sheets

PHOTORESIST COMPOSITION AND METHOD OF FORMING A PHOTORESIST PATTERN WITH A CONTROLLED REMNANT RATIO

CLAIM FOR PRIORITY

This application claims priority to Korean Patent Application No. 2001-0049317, filed on Aug. 16, 2001, the entire disclosure of which is incorporated herein by reference.

BACKGROUND OF THE INVENTION

1. Field of the Invention

The present invention relates to a method of forming a semiconductor device, and more particularly, to a method of forming photoresist patterns having a reduced height.

2. Description of the Related Art

The speed of logic devices and central processing ("CPU") devices increases with a reduction in the size of gates. In particular, the space between gates becomes narrower in a cell having reduced gate sizes and a narrow pitch. Such devices may have an increased likelihood of "punch-through" by hot carriers. A nonuniformly-doped area may result in a decrease in the likelihood of punch-through by hot carriers in such devices. Nonuniform-doping may be performed with the implantation of ions.

Hereinafter, a general method of forming photoresist patterns for the implantation of ions will be described with reference to the attached drawings.

FIGS. 1 and 2 are schematic drawing for illustrating a method of forming photoresist patterns for the implantation of ions. Referring to FIG. 1, a semiconductor substrate 10 is coated with photoresist to form a photoresist layer 12. A mask pattern 11 includes transparent patterns 14 having a light transmissivity of about 100% and non-transparent patterns 16 having a light transmissivity of about 0%. The non-transparent patterns 16 may be formed of a non-transparent material such as chrome (Cr). Light passing through the mask pattern exposes selected areas of the photoresist 12.

Referring to FIG. 2, the photoresist layer 12 (FIG. 1) is exposed and developed to form photoresist patterns 18 such that ions may be implanted in the semiconductor substrate 10 at a doping angle θ. The "doping angle θ" refers to the angle at which ions are implanted on the substrate 10. Developing photoresist layer 12 using mask pattern 11 (FIG. 1) results in void areas 17 and photoresist pattern 18. The mask pattern 11 shields portions of the photoresist layer 12 and exposes other areas of the photoresist layer 12.

Materials for forming a photoresist layer 12 (FIG. 1) generally have relatively high etch resistance. That is, the photoresist patterns 18 which result from unexposed areas in the photoresist layer 12 are virtually unaffected by the exposure and etching of surrounding void area 17. In addition, conventional methods and materials used to form, expose, and develop a photoresist layer 12 and the photoresist layer 12 limit the resulting thickness of the photoresist layer 12. More specifically, the thickness of the photoresist layer 12 is generally equal to or greater than about 7,400 Å. Because of the high etch resistance of conventional photoresist materials, the height of the photoresist patterns 18 is almost identical to the thickness of the photoresist layer 12 (FIG. 1). High etching resistance is generally desirable to maintain the photoresist pattern 18.

In one application of photoresist patterns 18, the photoresist patterns 18 may function as a mask on the substrate 10 to perform ion implantation 20. The photoresist pattern 18 may be used to nonuniformly dope the semiconductor substrate 10 with ions. As shown in FIG. 2, the ion implantation 20 is performed at an angle of between about 60° and about −60°, with respect to the normal of the semiconductor substrate 10, to nonuniformly dope the semiconductor substrate 10 with ions.

In certain applications, gates may be fabricated on the semiconductor substrate 10, for example, in an area on the surface of the substrate 10 covered by the photoresist pattern 18. Because of improvements in semiconductor fabrication techniques, it is possible to reduce the size of the gates and the spaces between the gates. As a result, the void area 17 between photoresist pattern 18 is reduced and the aspect ratio of the photoresist patterns 18 is increased. If the height of the photoresist pattern 18 remains the same, it becomes difficult to achieve an appropriate doping angle θ due to the resulting geometries of a relatively high photoresist pattern 18 and relatively narrow void area 17. It is preferable that the height of photoresist patterns 18 is within 3,000–6,000 Å, which is almost identical to the height of gates, to achieve the appropriate doping angle θ. However, the thickness of the photoresist layer 12 formed through conventional methods and materials is typically about 7,400 Å.

One potential solution is to form a thinner photoresist layer 12 to achieve the appropriate doping angle θ geometry. However, if the photoresist layer 12 is thin, the step difference between the gates may stand out. Attempts to form such a photoresist layer may result in insufficient quality and characteristics in photoresist layer 12. In particular, a deep ultra-violet (DUV) process must be performed to form fine patterns. The poor coating of photoresist layer 12 may also cause nonuniformity in a critical dimension. As a result, it is difficult to perform an appropriate photolithography process with a relatively thin photoresist layer 12, for example, a photoresist layer 12 that is thinner than about 7,400 Å.

SUMMARY OF THE INVENTION

According to embodiments of the present invention, the remnant ratio of the photoresist layer and the resulting photoresist patterns may be controlled. As used herein, the term "remnant ratio" refers to the height of the photoresist pattern remaining after exposure and development compared with the height of the photoresist layer prior to exposure and development. For example, if the remnant ratio is 100%, the height of the photoresist patterns is identical to the thickness of the photoresist layer. If the remnant ratio is 50%, the height of the photoresist patterns is 50% of the thickness of the photoresist layer. In other words, the photoresist remaining to form the photoresist pattern is removed by 50% in the exposure and development process. Conventional photoresists have high etching resistance and typically have remnant ratios of above about 95%.

Embodiments of the invention can provide methods for forming a microelectronic structure having a patterned photoresist on a substrate. The patterned photoresist can have a remnant ratio of between about 40% and about 85%. Methods according the to the invention can include exposing a microelectronic structure having a substrate and a photoresist to light. The photoresist can be developed to provide a photoresist pattern having a remnant ratio of between about 40% and about 85%.

According to embodiments of the invention, a photoresist composition can include compositions according to Formulas 1 and 2. A semiconductor substrate can also be coated with photoresist composed of formulas 1 and 2. The photoresist layer can be exposed and developed to form photoresist patterns in which the remnant ratio is controlled.

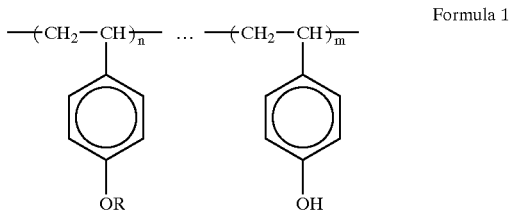

Formula 1 where R is an acetal group or a ter-butyloxy carbonyl (t-BOC) group, n and m are integers, n/(m+n) is 0.01–0.8, and m/(m+n) is 1−[n/(m+n)], and

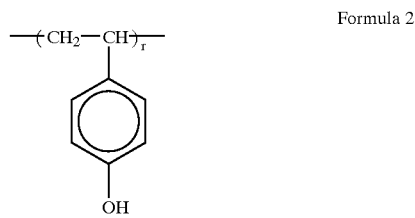

Formula 2 where r is an integer between 8–40.

In further embodiments, a photoresist layer can be formed on a semiconductor substrate. The photoresist layer can be exposed and developed using a mask pattern that includes first areas having a light transmissivity of about 100% and second areas having a light transmissivity of between about 10% and about 30%, to form photoresist patterns.

In still further embodiments according to the present invention, a semiconductor substrate can be coated with photoresist composed of the formulas 1 and 2 to form a photoresist layer. The photoresist layer is exposed and developed to form photoresist patterns having a remnant ratio of between about 40% and about 85%.

In certain embodiments, a photoresist layer is formed on a semiconductor substrate. The photoresist layer is exposed and developed using a mask pattern that includes first areas having a light transmissivity of about 100% and second areas having a light transmissivity of between about 10% and about 30%, to form photoresist patterns having a remnant ratio of between about 60% and about 85%.

DETAILED DESCRIPTION OF THE INVENTION

Figure 1:
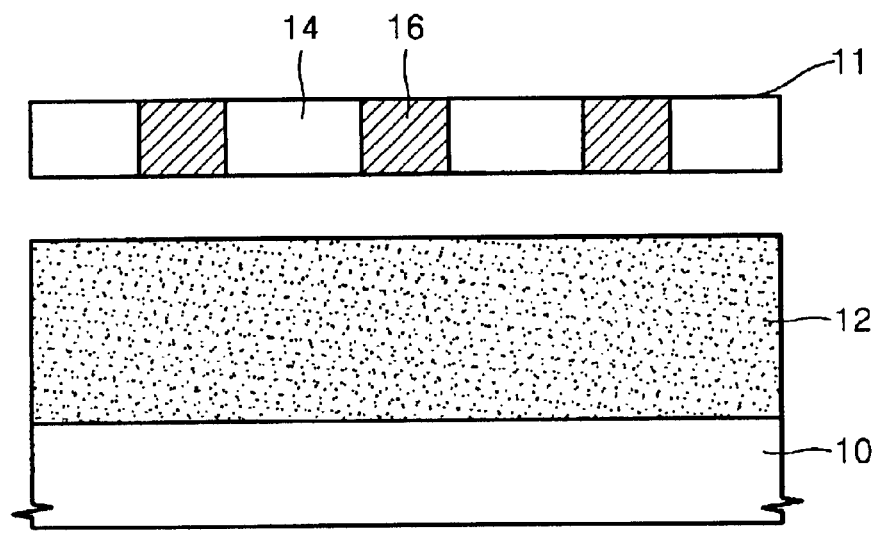
FIGS. 1 and 2 are cross sectional views of a substrate illustrating a prior art method of forming photoresist patterns for the implantation of ions.
Figure 2:
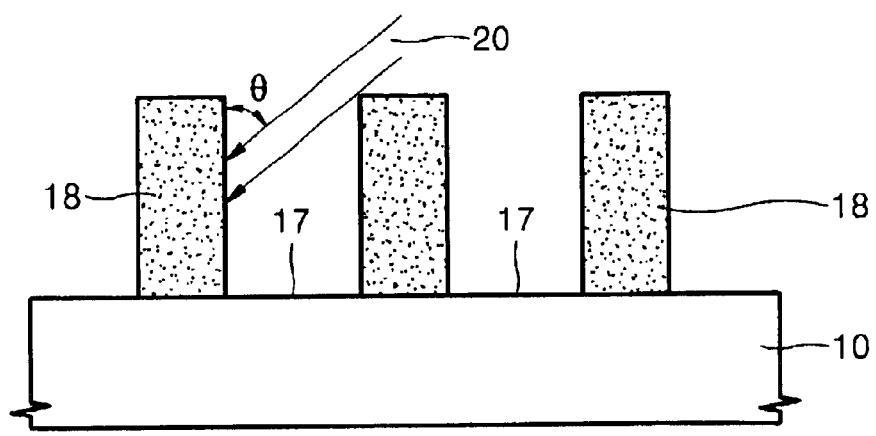

The present invention now will be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of elements may be exaggerated for clarity. When a layer is described as being formed "on" another layer or a semiconductor substrate, the layer may be formed directly on the other layer or semiconductor substrate, or other layers may be interposed therebetween. In contrast, when an element is referred to as being "directly on" another element, there are no intervening elements present. The thicknesses of layers or regions may be exaggerated for clarity. Like reference numerals in the drawings denote the same members.

According to embodiments of the present invention, photoresist patterns having a desired remnant ratio may be formed on a semiconductor substrate. Specifically, a portion of a photoresist layer can be removed when the photoresist layer is exposed and developed. The removal of portions of the photoresist layer can result in a photoresist pattern having a lower height than the photoresist layer prior to exposure and development. In certain embodiments, a microelectronic structure can be formed such that the resulting photoresist pattern has a remnant ratio of between about 40% and about 85%.

In certain embodiments, the remnant ratio is controlled by using a photoresist material that results in a lower remnant ratio, for example, due to a lower etching resistance. In other embodiments, the remnant ratio is controlled by using the transmissivity of a mask.

Photoresist Material

In order to control the remnant ratio, a photoresist of formula 1 is mixed with polyhydroxystyrene of formula 2 as an additive.

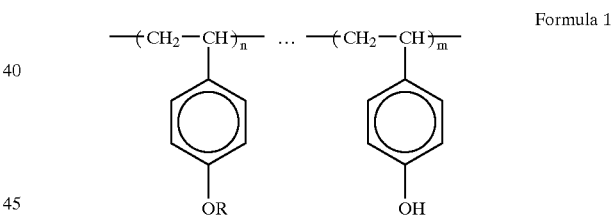

Formula 1 where R is an acetal group or a ter-butyloxy carbonyl (t-BOC) group, n and m are integers, n/(m+n) is 0.01–0.8, and m/(m+n) is 1−[n/(m+n)]. Here, the molecular weight of the photoresist of formula 1 is between about 3,000 and about 30,000, and the variance of the molecular weight of the photoresist is between about 1.1 and about 3.0.

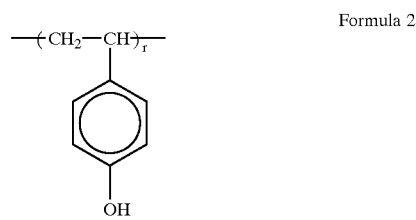

Formula 2 where r is an integer between 8–40. Here, the molecular weight of polyhydroxystyrene of formula 2 is within a range of between about 1,000 and about 5,000, and the distribution of the molecular weight of polyhydroxystyrene is between about 1.1 and about 3.0.

EXAMPLE

Mixture of formulas 1 and 2

20 g of the copolymer of t-butylcarbonyloxy-polystyrene and polyhydroxystyrene is dissolved in 100 g of ethyl lactate. 0.1 g of triphenyl sulfonyium is added to 4 g of poyhydroxystyrene. The dissolved copolymer is mixed with a mixture of poyhydroxystyrene and triphenyl sulfonyium.

While remnant ratios for conventional photoresists are typically above 95%, the remnant ratio of photoresists formed as described above is between about 40% and about 85%. Without wishing to be bound by theory, it is believed that the polyhydroxystyrene additive lowers the remnant ratio of the photosensitive compound of Formula 1. It is currently believed that polyhydroxystyrene serves as a dissolution promoter which lowers the etching resistance and lowers the remnant ratio. Thus, other polymers having a remnant ratio of between about 40% and about 85%, and which can serve as a dissolution promoter to lower the etching resistance and to lower the remnant ratio can be used. Another suitable additive is phenol-formaldehyde (Novolac) resin obtained by the reaction of acid catalysits and excess phenol.

If the remnant ratio is about 40% or lower, the resulting photoresist patterns may be susceptible to damage by subsequent processing. On the other hand, it may be difficult to achieve the appropriate doping angle in certain applications if the remnant ratio is 85% or higher. Therefore, a remnant ratio of between about 45% and about 65% may be preferable. A remnant ratio of about 50% may be more preferable.

Figure 3:
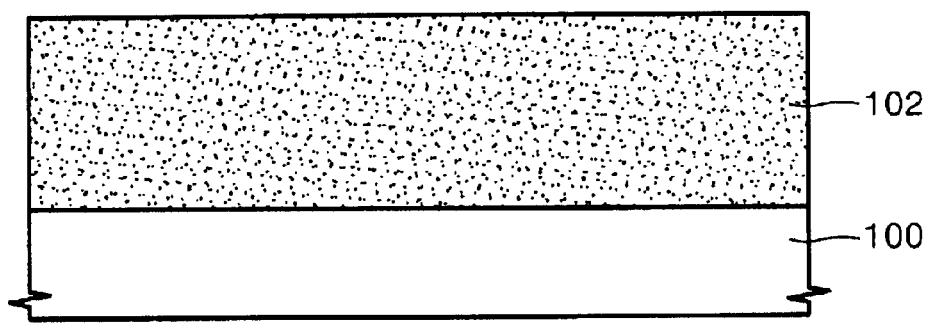
FIGS. 3 and 4 are cross sectional views of a substrate illustrating methods according to embodiments of the present invention for forming photoresist patterns where the remnant ratio of photoresist is controlled.
Figure 4:
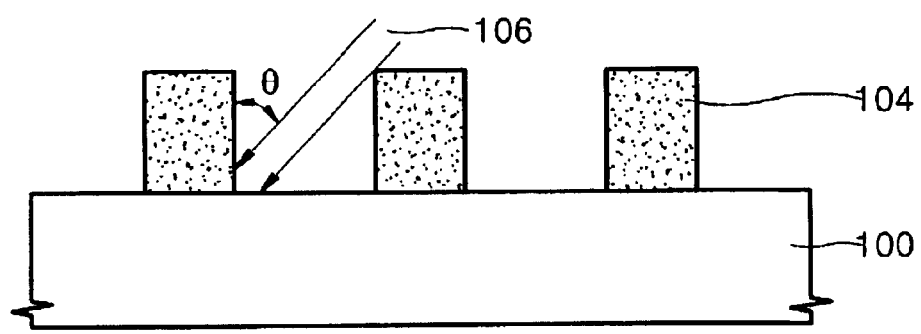

FIGS. 3 and 4 are cross sectional views of a substrate illustrating methods according to embodiments of the present invention for forming photoresist patterns where the remnant ratio of photoresist is controlled. With reference to FIGS. 3 and 4, a semiconductor substrate 100 can be coated with photoresist formed of the combination of formulas 1 and 2 as described above. The photoresist can be exposed using a mask, such as mask 11 in FIG. 1, which may include transparent patterns 14 having a light transmissivity of about 100% and non-transparent patterns 16 having a light transmissivity of about 0%. In certain embodiments, the photoresist 102 can be exposed to light using a KrF stepper and then developed with tetramethyl ammonium hydroxyde (TMAH) of 2.38 wto. As a result, photoresist patterns 104 are formed for ion implantation 106. The remnant ratio of the photoresist patterns 104 can be about 50%. The developer for developing the photoresist can be one of TMAH, methanol, ethanol, NaOH, and choline. The time for developing the photoresist can be between about 30 and about 120 seconds.

In the example shown in FIGS. 3 and 4, a semiconductor substrate 100 can be coated with photoresist formed of the combination of formulas 1 and 2 to form a photoresist layer 102. The photoresist layer 102 can be exposed and developed to form photoresist patterns 104, which can have a remnant ratio of about 50%. Ion implantation 106 can be performed using the photoresist patterns 104 as a mask pattern to implant ions into the semiconductor substrate 100. A nonuniformly-doped area may be formed during the ion implantation 106 and a doping angle α of the ion implantation 106 is preferably within a range of about 60° to about −60°.

Mask Transmissivity

Figure 5:
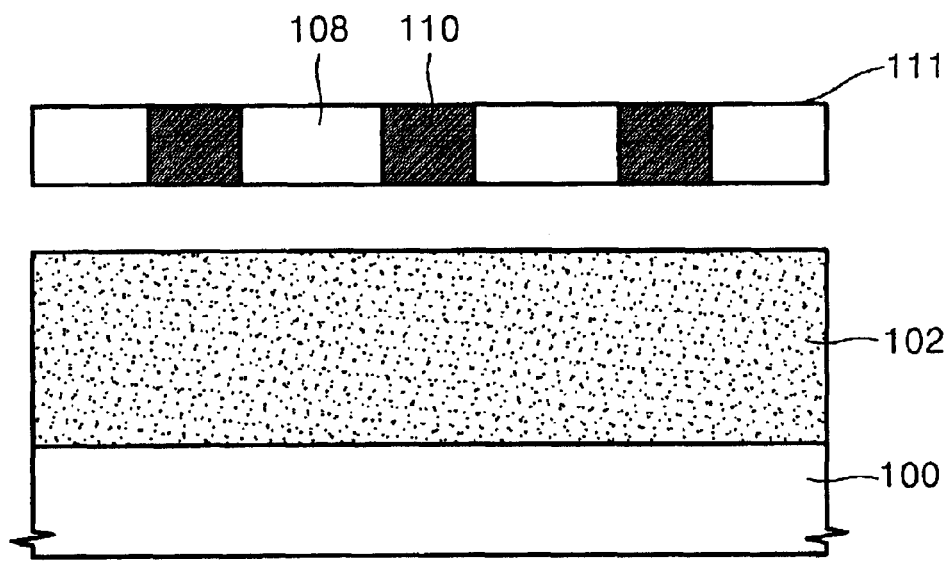
FIGS. 5 and 6 are cross sectional views of a substrate illustrating methods according to embodiments of the present invention for forming photoresist patterns where the remnant ratio of photoresist is controlled using a mask pattern.
Figure 6:
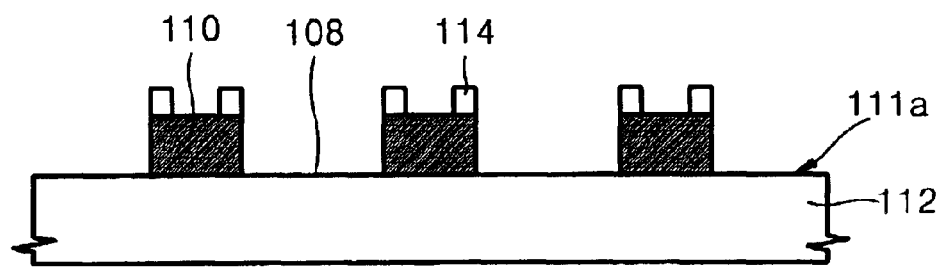

In certain embodiments according to the invention, the remnant ratio can be controlled by the transmissivity of a mask used to expose a photoresist. FIGS. 5 and 6 are cross sectional views of a substrate illustrating methods according to embodiments of the present invention for forming photoresist patterns where the remnant ratio of photoresist is controlled using a mask pattern. Referring to FIGS. 5 and 6, a mask pattern 111 can include first areas 108, which can have a light transmissivity of about 100% and second areas 110, which can have a light transmissivity of about 10% to about 30%. The second areas 110 may be formed of at least one of MoSiN, Cr, CrOx, CrSiO, CrSiON, SiN, amorphous carbon, or MoSi. The transmissivity of the second areas 110 can be controlled by the thickness of a material layer forming the second areas 110. In other words, if the material layer is thick, the transmissivity is low, and if the material layer is thin, the transmissivity is high.

The photoresist 102a depicted in FIG. 5 can be a conventional photoresist with high etching selectivity, for example, any photoresist known to those of skill in the art preferably with a remnant ratio of about 95% or higher. Polyhydroxystyrene, novolac, or other additives to lower the remnant ratio may or may not be added to the composition of photoresist 102a.

The remnant ratio may be decreased because the portion of the photoresist layer 102a that forms a photoresist pattern after exposure and development such as photoresist pattern 104 (FIG. 4) is exposed to a limited amount of light through the second areas 110. Second areas can have limited transmissivity, for example, between about 10% and about 30%, such that certain areas of the photoresist layer 102a are exposed to lower amounts of light compared to areas of the photoresist layer 102a that are entirely exposed by transmissive first areas 108. This is in contrast to conventional configurations such as mask 11 in FIG. 1, which has areas of either about 0% transmissivity (transparent patterns 14) or about 100% transmissivity (non-transparent transmissivity 16). The remnant ratio of photoresist patterns formed using the mask 111 can be between about 60% and about 85%. If the remnant ratio is equal to or less than about 60%, it may be more difficult to form a stable photoresist patterns. For example, the photoresist patterns formed with mask 111 with a remnant ratio under about 60% may collapse. On the other hand, if the remnant ratio is over about 85%, it may be more difficult to achieve an appropriate doping angle in certain applications. Thus, the remnant ratio of the photoresist patterns is preferably within a range of between about 60% and about 70%, more preferably, about 65%.

The mask 111 may include masking patterns and employ techniques known to those of skill in the art. For example, mask 111 may be a "phase shift mask." Examples of phase shift mask are disclosed in U.S. Pat. Nos. 5,895,735; 5,853,921; 5,851,706; 5,814,424; 5,789,116; and 5,741,613. Photomasks that are not phase shift masks may be limited in defining fine linewidths for highly integrated devices. Accordingly, phase shift masks have been used as an alternative for increasing integration density. In contrast with a conventional non-phase shifted transparent photomask, the phase shift mask operates on the principle that radiation such as light can exhibit interference patterns. For example, if radiation such as light from a light source passes through adjacent slits, the light emerging from the slits has different phases that can mutually interfere. A photomask using this interference principle is generally referred to as a phase shift mask. Phase shift masks can therefore offer increased resolution, improved depth of focus, and form very fine patterns compared to conventional non-phase shifted photomasks. Phase shift masks are especially useful in forming repeated line-space patterns where phase shifts of 180° between adjacent apertures can produce cancellation of light.

Referring to FIG. 6, mask 111a is a phase shift mask that includes first areas 108 and second areas 110 on a mask substrate 112 having a phase shift component 114 with a phase difference of between about 60° and about 180° such that desired patterns can be formed.

In addition, the photoresist composition described with reference to Formulas 1 and 2 may be used in combination with mask 111 or mask 111a. For example, the photoresist layer 102 of FIG. 3 can be exposed and developed using the mask pattern described with reference to mask 111 in FIG. 5 or mask 111a in FIG. 6 to form the photoresist patterns 104 in FIG. 4 on the semiconductor substrate 100. The ion implantation 106 of FIG. 4 can be performed using the photoresist patterns 104 as a mask to implant ions into the semiconductor substrate 100. A nonuniformly-doped area may be formed by the ion implantation 106. The doping angle θ of the ion implantation 106 can be within a range of between about 60° and about −60°.

Figure 7:
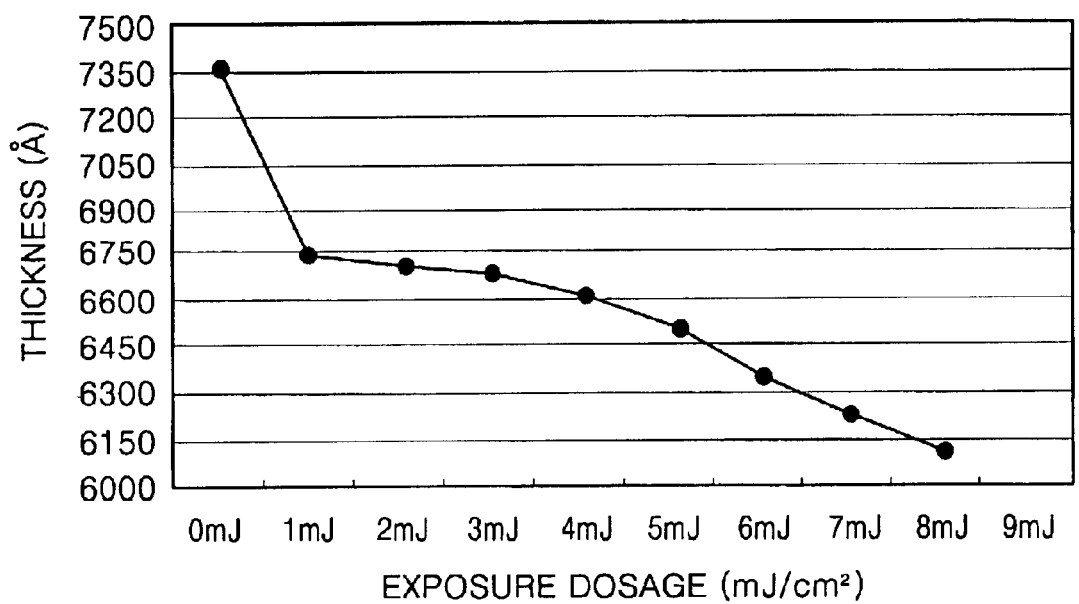
FIG. 7 is a graph showing the relationship between the exposure dosage to which a photoresist is exposed and the thickness of photoresist patterns formed using a mask pattern according to embodiments of the present invention.

FIG. 7 is a graph showing the relationship between exposure dosage (mJ/cm$^2$) resulting from a mask pattern and the thickness of photoresist patterns (A) formed when the remnant ratio of the photoresist is controlled using a mask pattern according to the present invention.

Exposure dosage for completely removing photoresist is 28 mJ/cm$^2$. Thus, the transmissivity of a mask pattern may be inferred from the exposure dosage (mJ/cm$^2$). If the exposure dosage is 6 mJ/cm$^2$, the transmissivity of the mask pattern is 6/28%, i.e., about 21%. If the exposure dosage is 2.8 mJ/cm$^2$, the transmissivity of the mask pattern is 2.8/28%, i.e., about 10%. According to FIG. 7, the height of the photoresist patterns 104 decreases with an increase in the exposure dosage and corresponding transmissivity of the mask pattern. If the transmissivity is less than about 10% (2.8 mJ/cm$^2$ exposure dosage), the height of the photoresist patterns 104 is approximately 6700 Å, which is generally an insufficient reduction in height for allowing an appropriate doping angle. On the other hand, if the transmissivity is over 30% (8.4 mJ/cm$_2$ exposure dosage), stable photoresist patterns may not be obtained. Thus, it is preferable that the transmissivity of the second areas 110 (FIGS. 5 and 6) is within a range of between about 10% and about 30%.

According to the present invention as described herein, photoresist patterns that are obtained where the remnant ratio is controlled can provide a mask for achieving an appropriate doping angle in the formation of nonuniformly-doped areas on a semiconductor substrate.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a microelectronic structure having a patterned photoresist on a substrate, the photoresist having a remnant ratio between about 40% and about 85%, the method comprising:

exposing a microelectronic structure having a substrate and a photoresist layer to light; and developing the photoresist to provide a photoresist pattern having a remnant ratio of between about 40% and about 85%.

2. The method of claim 1, wherein the photoresist comprises:

a first composition represented by Formula 1

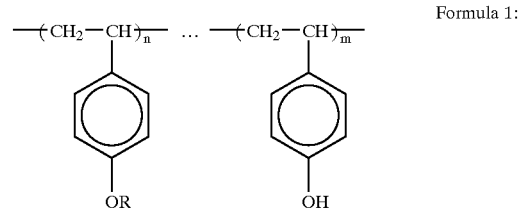

where R is an acetal group or a ter-butyloxy carbonyl (t-BOC) group, n and m are integers, n/(m+n) is 0.01–0.8, and n/(m+n) is 1−[n/(m+n)], and a second composition represented by Formula 2

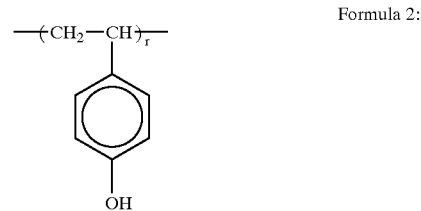

where r is an integer between 8–40.

3. The method of claim 2 wherein the molecular weight of Formula 1 is within between about 3,000 and about 30,000.

4. The method of claim 2 wherein the variance of the molecular weight of Formula 1 is between about 1.1 and about 3.0.

5. The method of claim 2 wherein the molecular weight of Formula 2 is between about 1,000 and about 5,000.

6. The method of claim 2 wherein the variance of the molecular weight of Formula 2 is between about 1.1 and about 3.0.

7. The method of claim 2 wherein the remnant ratio of the photoresist patterns is between about 45 and about 65%.

8. The method of claim 2 wherein the remnant ratio of the photoresist patterns is about 50%.

9. The method of claim 2 wherein a developer for developing the photoresist is one of TMAH, methanol, ethanol, NaOH, and choline.

10. The method of claim 2 wherein a time for developing the photoresist is within between about 30 and about 120 seconds.

11. The method of claim 1, wherein the exposing the microelectronic structure comprises:

exposing portions of the microelectronic structure to light using a mask pattern that comprises first areas having a light transmissivity of about 100% and second areas having a light transmissivity of between about 10% and about 30%, to form photoresist patterns.

12. The method of claim 11, wherein the remnant ratio of the photoresist patterns is between about 60 and about 85%.

13. The method of claim 11, wherein the remnant ratio of the photoresist patterns is between about 60 and about 70%.

14. The method of claim 11, wherein the remnant ratio of the photoresist patterns is about 65%.

15. The method of claim 11, wherein the second areas include one of MoSiN, Cr, CrOx, CrSiO, CrSiON, SiN, amorphous carbon, and MoSi.

16. The method of claim 11, wherein the transmissivity of the second areas is controlled by the thickness of a material layer forming the second areas.

17. The method of claim 11, wherein the first areas and the second areas have a phase difference of between about 60° and about 180°.

18. A microelectronic structure comprising:
a substrate; and
a photoresist layer on the substrate for controlling a remnant ratio, wherein the photoresist layer has a remnant ratio between about 40% and about 85%.

19. A microelectronic structure according to claim 18, wherein the photoresist comprises phenol-formaldehyde (NOVOLAC®) resin.

20. A microelectronic structure according to claim 18, wherein the photoresist comprises polyhydroxystyrene.

21. A microelectronic structure comprising:
a substrate; and
a photoresist layer on the substrate for controlling a remnant ratio, wherein the photoresist layer comprises:
a first composition represented by Formula 1

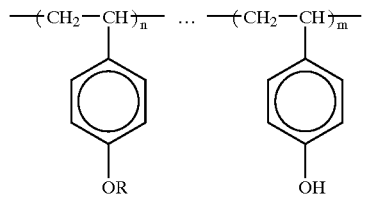

Formula 1:

where R is an acetal group or a ter-butyloxy carbonyl (t-BOC) group, n and m are integers, n/(m+n) is 0.01–0.8, and m/(m+n) is 1−[n/(m+n)], and
a second composition represented by Formula 2

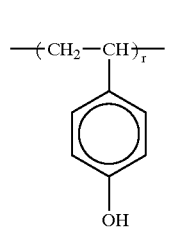

Formula 2:

where r is an integer between 8–40, wherein the remnant ratio of the photoresist layer after developing is between about 40% and about 85%.

22. A microelectronic structure of claim 21 wherein Formula 1 has a molecular weight between about 3,000 and about 30,000.

23. A microelectronic structure of claim 21 wherein the variance of the molecular weight in Formula 1 is between about 1.1 and about 3.0.

24. A microelectronic structure of claim 21 wherein the molecular weight of Formula 2 is between about 1,000 and about 5,000.

25. A microelectronic structure of claim 21 wherein the variance of the molecular weight in Formula 2 is between about 11.1 and about 3.0.

26. A microelectronic structure of claim 21 wherein the remnant ratio of the photoresist layer after development is between about 45% and about 65%.

27. A microelectronic structure of claim 21 wherein the remnant ratio of the photoresist layer after development is about 50%.

28. A microelectronic structure of claim 21 wherein the remnant ratio after development of the photoresist layer with one of TMAH, methanol, ethanol, NaOH, and choline is between about 40% and about 85%.

29. A microelectronic structure of claim 21 wherein the remnant ratio after development of the photoresist layer for between about 30 seconds and about 120 seconds is between about 40% and about 85%.

30. A method of forming photoresist patterns, the method comprising:
coating a semiconductor substrate with photoresist composed of Formulas 1 and 2 for controlling a remnant ratio to form a photoresist layer; and
exposing and developing the photoresist layer to form photoresist patterns having a controlled remnant ratio, wherein Formulas 1 and 2 comprise

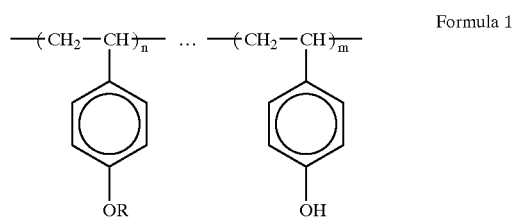

Formula 1 where R is an acetal group or a ter-butyloxy carbonyl (t-BOC) group, n and m are integers, n/(m+n) is 0.01–0.8, and m/(m+n) is 1−[n/(m+n)], and

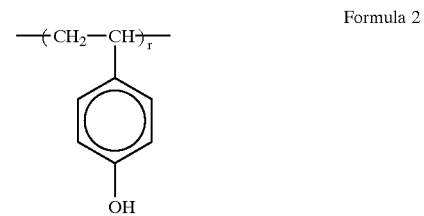

Formula 2 where r is an integer between 8–40, wherein the remnant ratio of the photo resist patterns is between about 40 and about 85%.

31. The method of claim 30, wherein the molecular weight of Formula 1 is within between about 3,000 and about 30,000.

32. The method of claim 30, wherein the variance of the molecular weight of Formula 1 is between about 1.1 and about 3.0.

33. The method of claim 30, wherein the molecular weight of Formula 2 is between about 1,000 and about 5,000.

34. The method of claim 30, wherein the variance of the molecular weight of Formula 2 is between about 1.1 and about 3.0.

35. The method of claim 30, wherein the remnant ratio of the photoresist patterns is between about 45 and about 65%.

36. The method of claim 30, wherein the remnant ratio of the photoresist patterns is about 50%.

37. The method of claim 30, wherein a developer for developing the photoresist is one of TMAH, methanol, ethanol, NaOH, and choline.

38. The method of claim 30, wherein a time for developing the photoresist is within between about 30 and about 120 seconds.

39. A method of forming photoresist patterns, the method comprising:
forming a photoresist layer on a semiconductor substrate;
exposing and developing the photoresist layer to control the remnant ratio using a mask pattern that includes first areas having a light transmissivity of about 100% and second areas having a light transmissivity of between about 10 and about 30%, to form photoresist patterns; and wherein the remnant ratio of the photoresist patterns is between about 60 and about 85%.

40. The method of claim 39; wherein the remnant ratio of the photoresist patterns is between about 60 and about 70%.

41. The method of claim 39, wherein the remnant ratio of the photoresist patterns is about 65%.

42. The method of claim 39, wherein the second areas include one of MoSiN, Cr, CrOx, CrSiO, CrSiON, SiN, amorphous carbon, and MoSi.

43. The method of claim 39, wherein the transmissivity of the second areas is controlled by the thickness of a material layer forming the second areas.

44. The method of claim 39, wherein the first areas and the second areas have a phase difference of between about 60 and about 180°.

45. A method of forming photoresist patterns, the method comprising:

coating a semiconductor substrate with photoresist composed of Formulas 1 and 2 to form a photoresist layer; and exposing and developing the photoresist layer to form photoresist patterns having a remnant ratio of between about 40 and about 85% wherein Formula 1 is

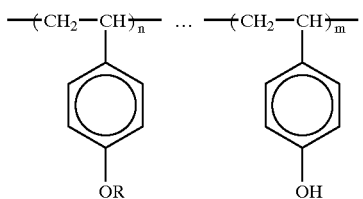

where R is an acetal group or a ter-butyloxy carbonyl (t-BOC) group, n and m are integers, n/(m+n) is 0.01–0.8, and m/(m+n) is 1−[n/(m+n)], and Formula 2 is

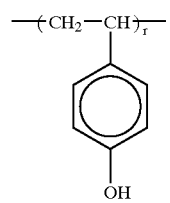

where r is an integer between 8–40.

46. The method of claim 45, wherein the molecular weight of Formula 2 is between about 1,000 and about 5,000.

47. The method of claim 45, wherein the variance of the molecular weight of Formula 2 is between about 1.1 and about 3.0.

48. The method of claim 45, wherein the remnant ratio of the photoresist patterns is between about 45 and about 65%.

49. The method of claim 45, wherein the remnant ratio of the photoresist patterns is about 50%.

50. A method of forming photoresist patterns, the method comprising:

forming a photoresist layer on a semiconductor substrate; and exposing and developing the photoresist layer using a mask pattern that includes first areas having a light transmissivity of 100% and second areas having a light transmissivity of between about 10% and about 30%, to form photoresist patterns having a remnant ratio of between about 60% and about 85%.

51. The method of claim 50, wherein the remnant ratio of the photoresist patterns is between about 60% and about 70%.

52. The method of claim 50, wherein the remnant ratio of the photoresist patterns is about 65%.

53. The method of claim 50, wherein the second areas include one of MoSiN, Cr, CrOx, CrSiO, CrSiON, SiN, amorphous carbon, and MoSi.

54. The method of claim 50, wherein the transmissivity of the second areas is controlled by the thickness of a material layer forming the second areas.

55. The method of claim 50, wherein the first areas and the second areas have a phase difference of between about 60° and about 180°.

* * * * *